US010175331B2

(12) United States Patent
Beck

(10) Patent No.: US 10,175,331 B2
(45) Date of Patent: Jan. 8, 2019

(54) PROPELLER WITH DIXON WATER FAT SEPARATION

(71) Applicant: KONINKLIJKE PHILIPS N.V., Eindhoven (NL)

(72) Inventor: Gabriele Marianne Beck, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 830 days.

(21) Appl. No.: 14/425,335

(22) PCT Filed: Sep. 3, 2013

(86) PCT No.: PCT/IB2013/058242
§ 371 (c)(1),
(2) Date: Mar. 3, 2015

(87) PCT Pub. No.: WO2014/037870
PCT Pub. Date: Mar. 13, 2014

(65) Prior Publication Data
US 2015/0212183 A1 Jul. 30, 2015

Related U.S. Application Data

(60) Provisional application No. 61/696,555, filed on Sep. 4, 2012.

(51) Int. Cl.
*G01R 33/385* (2006.01)
*G01R 33/565* (2006.01)
(Continued)

(52) U.S. Cl.
CPC ..... *G01R 33/56527* (2013.01); *G01R 33/385* (2013.01); *G01R 33/482* (2013.01);
(Continued)

(58) Field of Classification Search
USPC ......................... 324/300–322; 600/407–435; 382/128–131
See application file for complete search history.

(56) References Cited

U.S. PATENT DOCUMENTS 6,150,815 A 11/2000 Janzen
7,023,207 B1 4/2006 Gaddipati et al.
(Continued)

FOREIGN PATENT DOCUMENTS

EP 2461175 A1 6/2012
RU 2270995 C1 2/2006
(Continued)

OTHER PUBLICATIONS

He, Qiang et al "Regularized Iterative Reconstruction for Undersampled Blade and its Applications in Three-Point Dixon Water-Fat Separation", Magnetic Resonance in Medicine, vol. 65, 2011, pp. 1314-1325.
(Continued)

*Primary Examiner* — Melissa Koval
*Assistant Examiner* — Tiffany Fetzner

(57) ABSTRACT

The invention relates to a magnetic resonance imaging system (100) for acquiring at least one set of k-space blade data from an imaging zone of a subject (118), wherein the magnetic resonance imaging system (100) comprises a memory (138) for storing machine executable instructions and a processor (130) for controlling the magnetic resonance imaging system (100), wherein execution of the machine executable instructions causes the processor (130) to perform for each blade of the at least one set of k-space blade data: control the MRI system (100) to acquire at least one k-space blade data using at least one echo time for purposes of performing a Dixon technique, wherein k-space blade data are acquired in accordance with a blade shape; reconstruct at least one blade image data using the at least one
(Continued)

k-space blade data; generate water blade image data and fat blade image data using the at least one blade image data; and transform the water and fat blade image data to water and fat k-space blade data respectively and perform PROPELLER reconstruction of the water and fat k-space blade data.

18 Claims, 4 Drawing Sheets

(51) Int. Cl.
*G01R 33/48* (2006.01)
*G01R 33/54* (2006.01)
*G01R 33/561* (2006.01)

(52) U.S. Cl.
CPC ..... *G01R 33/4818* (2013.01); *G01R 33/4824* (2013.01); *G01R 33/4828* (2013.01); *G01R 33/546* (2013.01); *G01R 33/5615* (2013.01); *G01R 33/5618* (2013.01)

(56) References Cited

U.S. PATENT DOCUMENTS

| | | | | |
|---|---|---|---|---|
| 8,692,551 | B2* | 4/2014 | He | A61B 5/055 324/309 |
| 9,390,476 | B2* | 7/2016 | Weng | G01R 33/4828 |
| 9,739,859 | B2* | 8/2017 | Bachschmidt | G01R 33/4828 |
| 2002/0167319 | A1 | 11/2002 | Ikezaki | |
| 2008/0157767 | A1 | 7/2008 | Bammer et al. | |
| 2008/0161678 | A1 | 7/2008 | Miyazaki et al. | |
| 2011/0267054 | A1* | 11/2011 | He | A61B 5/055 324/309 |
| 2011/0274331 | A1* | 11/2011 | Weng | G01R 33/4824 382/131 |
| 2014/0003694 | A1* | 1/2014 | Weng | G01R 33/4828 382/131 |
| 2014/0077802 | A1* | 3/2014 | Bachschmidt | G01R 33/4828 324/307 |
| 2015/0108976 | A1* | 4/2015 | Fischer | G01R 33/5616 324/309 |
| 2015/0212183 | A1* | 7/2015 | Beck | G01R 33/4818 324/309 |
| 2017/0199258 | A1* | 7/2017 | Beck | G01R 33/4828 |

FOREIGN PATENT DOCUMENTS

RU 2308709 C1 10/2007
WO 8803780 A1 6/1988

OTHER PUBLICATIONS

Pipe, James G. "Motion Correction with PROPELLER MRI: Application to Head Motion and Free-Breathing Cardiac Imaging", Magnetic Resonance in Medicine, vol. 42, 1999, pp. 963-969.
Feng, Yanqiu et al "Affine Motion Compensation with Improved Reconstruction in PROPELLER MRI", 31st Annual International Conf. of the IEEE EMBS, 2009, pp. 2680-2683.
Reeder, Scott B. et al "Multicoil Dixon Chemical Species Separation with an Iterative Least-Squares Estimation Method", Magnetic Resonance in Medicine, vol. 51, 2004, pp. 35-45.
Kellman, P. et al "Improved Cardiac Shim using Field Map Estimate from Multi-Echo Dixon Method", Proceedings of the Intenational Society for Magnetic Resonance in Medicine, vol. 17, 2009, pp. 4522.
Ma, Jingfei "Multi-Point Dixon Imaging with Reduced Time and Increased Reliability", Proceedings of the Society of Magnetic Resonance in Medicine, vol. 1, 1998, pp. 622.
Weng, Dehe "Water Fat Separation with BLADE based on Two Points Dixon Technique", Proceedings of the International Society for Magnetic Resonance in Medicine, vol. 20, Apr. 2012, pp. 2489.
Huo, Donglai et al "Turboprop IDEAL: A Motion-Resistant Fat-Water Separation Technique", Magnetic Resonance in Medicine, vol. 61, 2009, pp. 188-195.

* cited by examiner

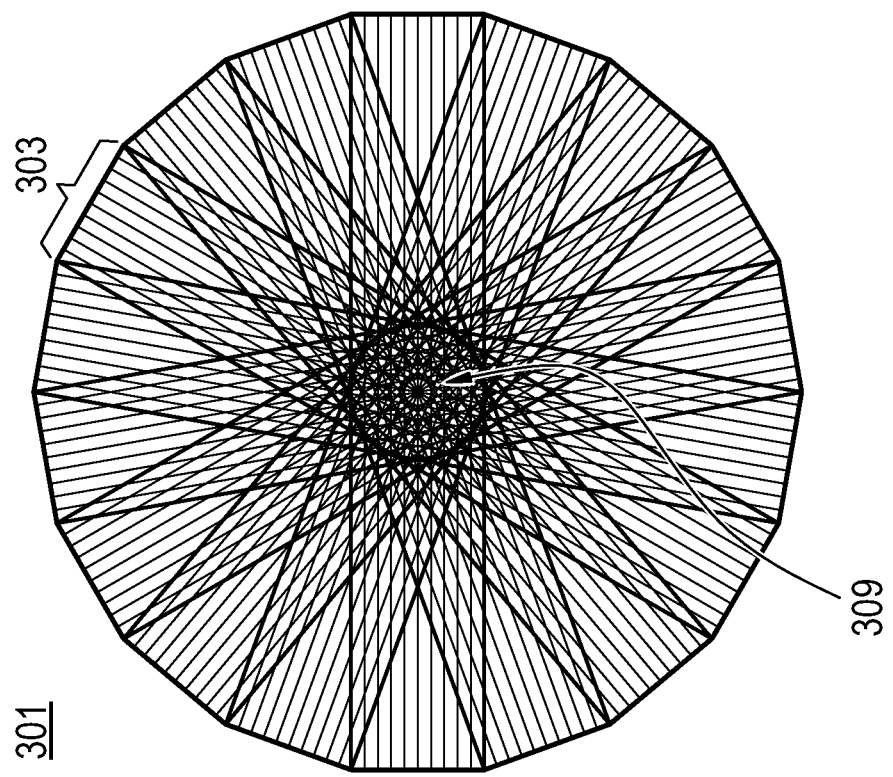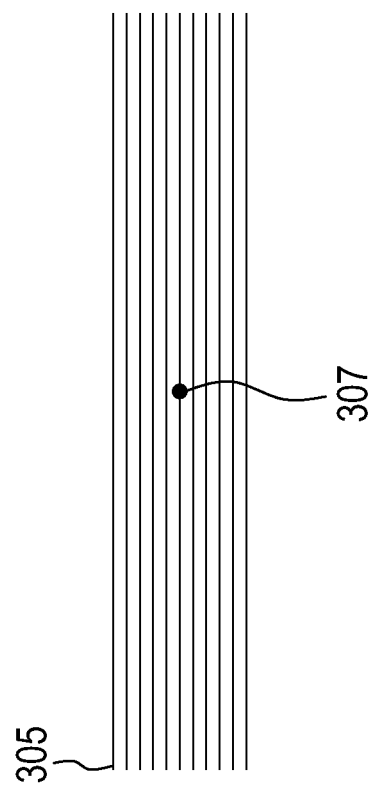
FIG. 3

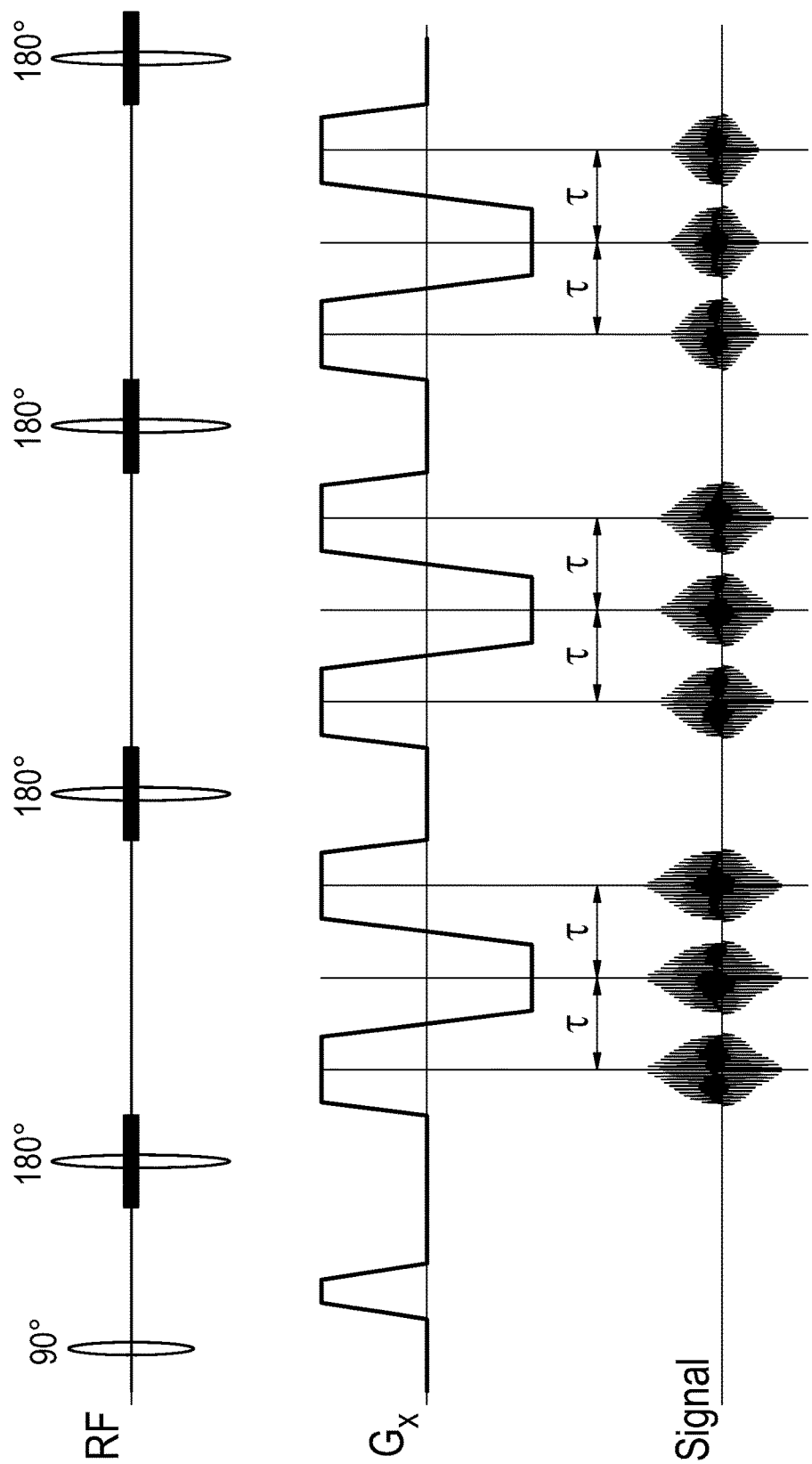

PROPELLER WITH DIXON WATER FAT SEPARATION

CROSS-REFERENCE TO PRIOR APPLICATIONS

This application is the U.S. National Phase application under 35 U.S.C. § 371 of International Application No. PCT/IB2013/058242, filed on Sep. 3, 2013, which claims the benefit of U.S. Provisional Patent Application No. 61/696,555, filed on Sep. 4, 2012. These applications are hereby incorporated by reference herein.

TECHNICAL FIELD

The invention relates to magnetic resonance imaging, in particular to Propeller with Dixon water-fat separation.

BACKGROUND OF THE INVENTION

Propeller is an attractive method regarding the minimization of severe motion and pulsation oversampling the central part of k-space. However, it is sensitive to various sources of image artifacts such as main B0 field inhomogeneities.

J. G. Pipe (Magnetic Resonance in Medicine 42:963-969 (1999)) discloses a method for motion correction with PROPELLER MRI and its application to head motion and free-breathing cardiac imaging.

SUMMARY OF THE INVENTION

Embodiments of the invention may provide for a method for acquiring at least one set of k-space blade data, a magnetic resonance imaging system and a computer program product.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

In one aspect, the invention relates to a magnetic resonance imaging system for acquiring at least one set of k-space blade data from an imaging zone of a subject, wherein the magnetic resonance imaging system comprises a memory for storing machine executable instructions and a processor for controlling the magnetic resonance imaging system.

The at least one set of k-space blade data may comprise blades in a PROPELLER geometry, wherein each of the blade is composed of L equidistant, parallel phase encoding lines. A blade is composed of the L lines of a conventional k-space trajectory with Cartesian sampling. The individual k-space blade data are rotated relative to one another around a central point of k-space. The individual k-space blades thus intersect in a central region of k-space.

The execution of the machine executable instructions causes the processor to perform for each blade of the at least one set of k-space blade data: control the MRI system to acquire at least one k-space blade data using at least one echo time for purposes of performing a Dixon technique, wherein k-space blade data are acquired in accordance with a blade shape. Dixon technique refers to a technique based on spin echo or gradient echo type sequences generally. According to the per se known Dixon technique, the spectral difference between fat and water spins are made use of for the purpose of separating MR signals emanating from water containing tissue and MR signals emanating from fat tissue. In Dixon-type imaging, typically two acquisitions are repeated with different echo times, wherein the fat magnetization in the second acquisition is out of phase relative to the first acquisition at the respective echo time. Separate and distinct water, fat and B0 maps are obtained by iterative decomposition from the complex MR signals.

Dixon technique may be one-point Dixon, two-point Dixon or more point Dixon. The number of points refers to number of images with distinct water-fat phase differences that are acquired per slice location. For example, for a two-point Dixon technique the MRI system may acquire two k-space blade data (for the same blade position and shape) associated with two different echo times. This echo times may be arbitrarily chosen as long as the accumulated phase between water and fat are different; for simplicity the special case of "in phase" and "opposed phase" echo times is referred to in the description. In case of a two-point Dixon technique, in the first k-space blade data the signal from fat-protons and from water-protons may be "in phase", while in the second k-space blade data they are "opposed phase". The Dixon sequence may be a multi acquisition or multi gradient echo type sequence. Multi acquisition hereby requires separate acquisitions with different echo times. Multi gradient echo type sequence acquires several gradient echoes with different echo times per RE excitation.

The execution of the machine executable instructions further causes the processor to perform for each blade of the at least one set of k-space blade data: reconstruct at least one blade image data using the at least one k-space blade data; and generate water blade image data and fat blade image data using the at least one blade image data. For example, in case of a single-point Dixon technique separate water and fat images may be obtained from a complex image (e.g. at least one blade image data) as the real and imaginary part.

The execution of the machine executable instructions further causes the processor to perform for each blade of the at least one set of k-space blade data: transform the water and fat blade image data to water and fat k-space blade data respectively and perform PROPELLER reconstruction of the water and fat k-space blade data.

The image data may be converted to k-space data using an inverse Fast Fourier Transformation (FFT). The PROPELLER reconstruction of each water and fat k-space blade data lead to the final water image data set and fat image data set that can be combined to a non fat suppressed image data set.

Said features may be advantageous as they combine the key advantages of Dixon and Propeller and that is providing a motion robust solution that is insensitive to fat and off-resonance streaking artifacts while providing a separate water image data set with a complete suppression of fatty tissue next to providing a fat, IP or OP image data set. Hence said features may be especially interesting in Body applications and at higher field strengths where fat suppression may be an issue and where a high sensitivity to motion in general can be expected.

It will be apparent to those skilled in the art that the current subject matter may be also applied to systems with multiple chemical species, ensuring for example water, fat and silicone separation.

In one embodiment, the generating comprises applying a water-fat shift correction to the fat blade image data before the fat blade image data is transformed to fat blade k-space data and Propeller reconstruction is performed.

This embodiment may be advantageous as it reduces the effect of the water fat shift to which the propeller reconstruction is very sensitive. This is particularly important for a situation where the artifact becomes important such as the examination of structures like organs as the kidneys that are typically surrounded by fat.

In one embodiment, the water-fat shift correction to the fat blade image data comprises correcting the expected pixel shift in the readout direction defined by the frequency bandwidth and/or by registering the fat blade image data relative to the water blade image data.

Dependent on the choice of the frequency bandwidth and respective water fat shift, the chemical shift in the readout direction can be in the order of several pixels, but can be also less prominent and typically shows in a star like appearance in structures (kidneys) surrounded by fat in Propeller type acquisitions.

In one embodiment, the Dixon technique comprises of at least-two-point Dixon technique, the at least one blade image data comprising at least two blade image data, wherein the execution of the machine executable instructions further causes the processor to combine the at least two blade image data to produce the water and fat blade image data.

The at least two blade image data are reconstructed using at least two k-space blade data. In case of a two-point Dixon technique, imaging is performed by acquiring two separate images: one where the signals from fat F and water W for example are out of phase (OP=W−F) and one where they are in phase (IP=W+F). Separate water and fat images thus may be obtained in this simple example from the sum and difference of these images, respectively.

When the main static field B0 is inhomogeneous, there are locations in the subject for which the water is not on resonance. In this case, iterative decomposition from the complex MR signals incorporating a B0 map estimate may improve the Dixon water fat separation.

Hence, in one embodiment, the execution of the machine executable instructions further causes the processor to estimate a B0 field inhomogeneity map from the at least two blade image data.

In one embodiment, the estimated B0 field inhomogeneity map is used to correct for off resonance effects in the water and fat blade data and hereby remove off resonance streaking and blur artifacts. These artifacts may be introduced by the Propeller type acquisition. B0 field inhomogeneities are usually termed off-resonance. In general, corrections can be done in the image or k-space domain, hereby referring to water (fat) blade data.

Since the Propeller type acquisition continuously rotates blades, off resonance differences in those blades lead to off resonance streaking and blur artifacts. Incorporating the B0 field inhomogeneity map information from the Dixon reconstruction in the Propeller reconstruction allows to deblur and remove off resonance streaking artifacts in the Dixon water and fat data sets.

In one embodiment, the execution of the machine executable instructions further causes the processor to:
reconstruct water motion image data using a central region of the water k-space blade data;
define a water reference blade;
determine water affine motion transformation data of at least part of the water motion image data by registering the water motion image data relative to the water reference blade; and
correct the water blade data for motion of the water segment using the water affine motion transformation data.

For example, the water reference blade may be the initial blade. The water reference blade may be also the blade with the highest correlation between its data in the central disc of k-space and the mean of the same data from all blades. This may be advantageous as it may provide an accurate motion correction.

In one embodiment, the execution of the machine executable instructions further causes the processor to:
reconstruct fat motion image data using a central region of the fat k-space blade data;
define a fat reference blade;
determine fat affine motion transformation data of at least part of the fat motion image data by registering the fat motion image data relative to the fat reference blade; and
correct the fat blade data for motion of the fat segment using the fat affine motion transformation data.

A central circular portion in k-space, having a diameter L, is acquired for each k-space blade. This central portion may be used to reconstruct a low-resolution image (e.g. water motion image data) for each k-space blade. These low-resolution images are compared to the reference blade to remove in-plane displacements and rotations etc., which may be due to patient motion.

The fat motion image data may be corrected for water fat shifts before registering the fat motion image data relative to the fat reference blade. This has the advantage of providing an improved fat motion description.

In addition, rejection of data with a bad correlation that may have experienced through plan motion can be accomplished as in standard Propeller, reconstructing with less Propeller blades. In Propeller, an oversampling of the central portion of k-space allows to intrinsically obtain motion information of the examined patient next to retrospectively correct and reject motion corrupted data.

This may be advantageous in that the central part of k-space data may be used as a 2D navigator to correct data without acquisition of additional echoes while interference problems of navigator and imaging stack may be avoided. Also, the oversampling of the central part allows retrospective correction and rejection of motion corrupted data.

In case of more complex motion, automatic segmentation of a structure of interest that should be motion corrected can be used to determine affine motion transformation data only from a localized area. Separate water and fat data sets that incorporate decoupled water and fat motion compensation can also use automatic segmentation routines that focus on different areas of interest for water and fat.

In one embodiment, the execution of the machine executable instructions further causes the processor to:
reconstruct at least two motion data per blade using a central region of the at least two k-space data acquired with different echo times;
generate motion water image data, motion fat image data and motion B0 image data using the at least two motion data;
determine at least water affine motion transformation data of the motion water image data with respect to a motion water image of a reference blade;
correct at least the water blade data for motion of the water segment using the water affine motion transformation data; and
correct the water blade data for motion induced B0 field inhomogeneity differences by the use of the motion B0 image data hereby removing motion induced off resonance streaking artifacts.

Motion induced B0 differences may be also removed in fat blade data respectively.

The present subject matter may be combined with parallel imaging techniques and compressed sensing techniques to speed up data acquisition and to increase the motion detection sensitivity with an increased resolution of the motion data. Also any type of Dixon improvements such as the use of a multi peak model to improve the Dixon reconstruction may be combined with the present subject matter.

In one aspect, the invention relates to a method for acquiring by an MRI system at least one set of k-space blade data from an imaging zone of a subject, comprising for each blade of the at least one set of k-space blade data:

controlling the MRI system to acquire at least one k-space blade data using at least one echo time for purposes of performing a Dixon technique, wherein k-space blade data are acquired in accordance with a blade shape;

reconstructing at least one blade image data using the at least one k-space blade data;

generating water blade image data and fat blade image data using the at least one blade image data; and transforming the water and fat blade image data to water and fat k-space blade data respectively and perform PROPELLER reconstruction of the water and fat k-space blade data.

In one aspect, the invention relates to a computer program product comprising computer executable instructions to perform the method steps of the method described above.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 3 illustrates the k-space sampling scheme of PROPELLER MRI, and FIG. 4 shows a pulse sequence diagram.

DETAILED DESCRIPTION OF THE EMBODIMENTS

In the following, like numbered elements in the figures are either similar elements or perform an equivalent function. Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
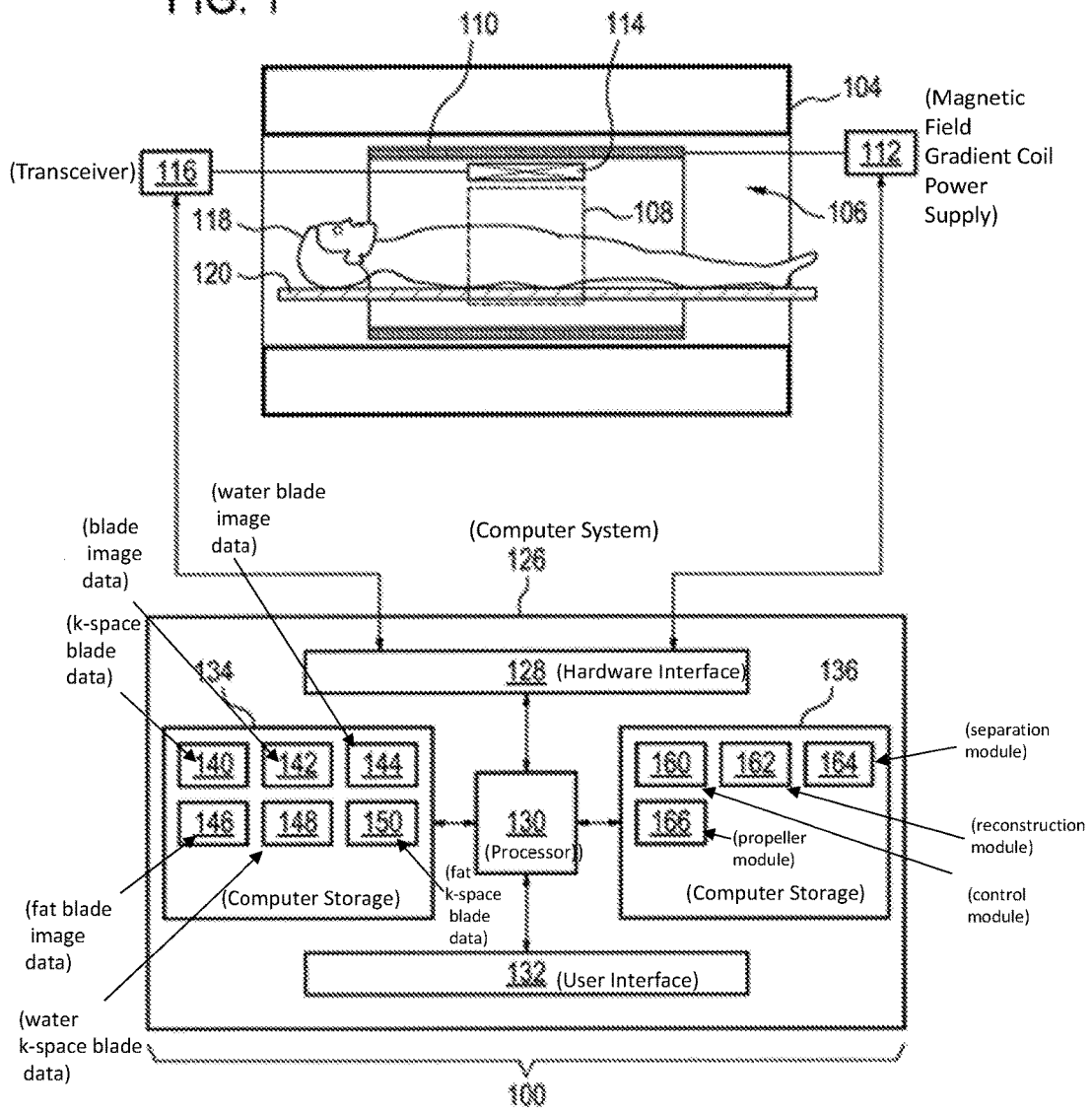
FIG. 1 illustrates a magnetic resonance imaging system.

FIG. 1 illustrates an example of a magnetic resonance imaging system 100. The magnetic resonance imaging system 100 comprises a magnet 104. The magnet 104 is a superconducting cylindrical type magnet 100 with a bore 506 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers.

The magnetic field gradient coil power supply 112 and the transceiver 116 are connected to a hardware interface 128 of computer system 126. The computer system 126 further comprises a processor 130. The processor 130 is connected to the hardware interface 128, a user interface 132, computer storage 134, and computer memory 136.

The computer storage 134 is shown as containing at least one k-space blade data 140. The at least one k-space data is acquired from a target volume of the imaging zone 108 by the MRI system 100. The computer storage 134 is further shown as containing at least one blade image data 142 being reconstructed using the at least one k-space blade data 140. The computer storage 134 is further shown as containing water blade image data 144 and fat blade image data 146 using the at least one blade image data 142. The computer storage 134 is further shown as containing water and fat k-space blade data 148, 150 being transformed from the water and fat blade image data 144, 146.

The computer memory 136 is shown as containing a control module 160. The control module 160 contains computer-executable code which enables the processor 130 to control the operation and function of the magnetic resonance imaging system 100. It also enables the basic operations of the magnetic resonance imaging system 100 such as the acquisition of magnetic resonance data. The processor 130 used the control module 160 to acquire the at least one k-space blade data 140.

The computer memory 136 is further shown as containing a reconstruction module 162. The reconstruction module 162 contains computer-executable code which enables the processor 130 to reconstruct the at least one blade image data 142 using the at least one k-space blade data 140.

The computer memory 136 is further shown as containing a separation module 164. The separation module 164 contains computer-executable code which enabled the processor 130 to generate the water blade image data 144 and fat blade image data 146 using the at least one blade image data 142.

The computer memory 136 is further shown as containing a propeller module 166. The propeller module 166 contains computer-executable code which enables the processor 130 to transform the water and fat blade image data 144, 146 to water and fat k-space blade data 148, 150 and perform PROPELLER reconstruction of the water and fat k-space blade data.

Figure 2:
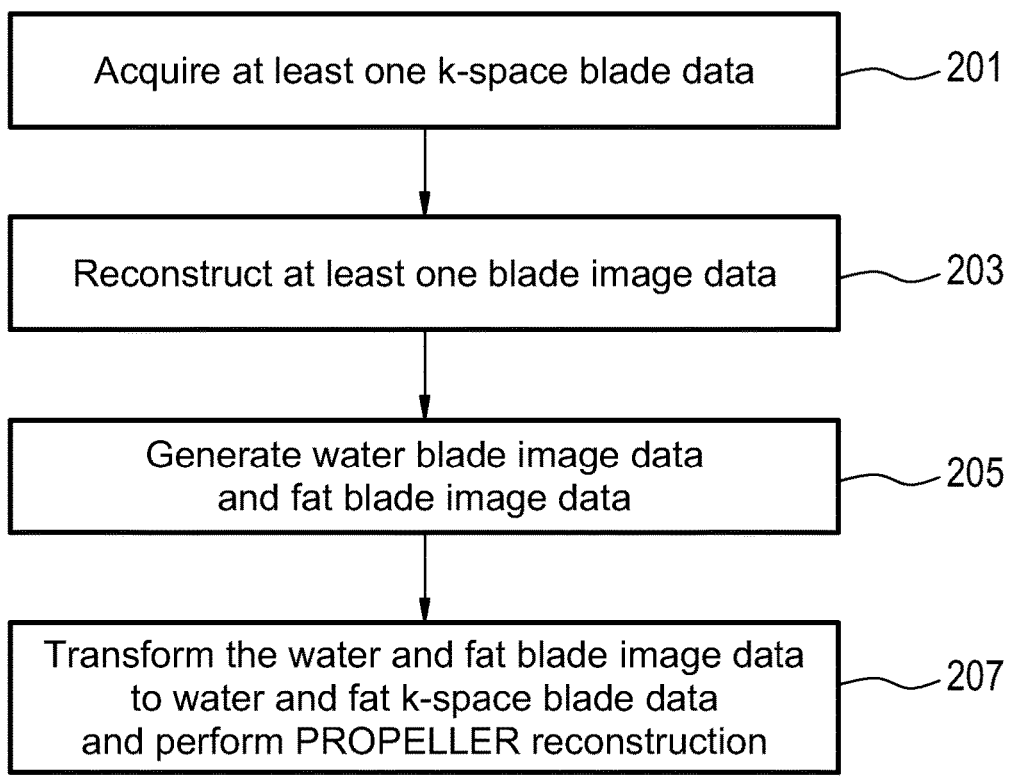
FIG. 2 shows a flowchart of a method for acquiring at least one set of k-space blade data.

For the purpose of explanation, the method described in FIG. 2 can be implemented in the MRI system in FIG. 1, but is not limited to this implementation. Therefore, reference numerals from FIG. 1 are not necessarily used in FIG. 2.

FIG. 2 is a flowchart of a method for acquiring by an MRI system at least one set of k-space blade data from an imaging zone of a subject.

In step 201, for each blade of the at least one set of k-space blade at least one k-space blade data is acquired using at least one echo time for purposes of performing a Dixon technique, wherein k-space blade data are acquired in accordance with a blade shape.

In step 203, at least one blade image data is reconstructed using the at least one k-space blade data. The Dixon technique comprises of at least-two-point Dixon technique, the at least one blade image data comprising at least two blade image data. The at least two blade image data may be combined to produce the water and fat blade image data. A B0 field inhomogeneity map from the at least two blade image data may be estimated and used to correct for off resonance effects in the water and fat data sets and hereby remove off resonance streaking artifacts.

In step 205, water blade image data and fat blade image data are generated using the at least one blade image data. A water-fat shift correction may be applied to the fat blade image data. The water-fat shift correction comprises correcting the expected pixel shift in the readout direction defined by the frequency bandwidth and/or by registering the fat blade image data relative to the water blade image data.

In step 207, the water and fat blade image data are transformed to water and fat k-space blade data and a PROPELLER reconstruction of the water and fat k-space blade data is performed. For example, the water (fat) blade data may be corrected for motion of the water (fat) segment using a water (fat) affine motion transformation data. The water (fat) affine motion transformation data of water (fat) motion image data is determined by registering the water (fat) motion image data relative to the water (fat) reference blade. The water (fat) motion image data are reconstructed using a central region of the water (fat) k-space blade data.

FIG. 3 illustrates an example of k-space sampling of PROPELLER MRI technique.

In the example shown in FIG. 3, N k-space PROPELLER blades 303 are acquired forming a two-dimensional k-space matrix 301. The sampling points of each k-space blade lie on a Cartesian sampling grid in each k-space blade 303. The length of each k-space line 305 may cover for example the full width of the k-space matrix 301. The individual k-space blades 303 are rotated relative to one another around a central point 307 so that a central, circular region 309 of the k-space matrix 301 is covered by each k-space blade 303 resulting in a k-space sampling pattern that resembles a propeller. The rotation angle and the number N may be chosen such that the k-space blades cover an entire desired k-space region.

The k-space data of the k-space region are acquired with a Dixon technique.

In the example of two-point Dixon technique the method provides two set of the N blades are acquired. This may be based on a multiple-shot fast spin-echo (FSE) (see FIG. 4 for the corresponding sequence of 3-point Dixon technique), in which the k-space lines are acquired in each TR, forming a blade centred at the origin of k-space 307. Each blade of the first and the second set of blades are acquired with different echo times.

The central disc of k-space 309 is sampled by all blades and can be used as a 2D navigator. Comparison of this k-space disc between each blades of one set and a reference blade allows correction of the subject's in-plane motion such as rotation and/or translation.

FIG. 4 shows a pulse sequence diagram of a FSE of three point Dixon technique.

After each refocusing pulse, three consecutive readout gradients are used to acquire three echo signals. The time spacing between two consecutive echoes is tau. These three echoes have a relative water/fat phase shift of −180°, 0°, and 180° (in case of two point Dixon technique the two echoes have a relative water/fat phase shift of 0° and 180°), respectively. Thus, a single scan can generate three k-space blade data, which are then used to generate separate water-only and fat only blade images.

LIST OF REFERENCE NUMERALS 100 magnetic resonance imaging system
104 magnet
106 bore of magnet
108 imaging zone
110 magnetic field gradient coils
112 magnetic field gradient coil power supply
114 radio-frequency coil
116 transceiver
118 subject
120 subject support
126 computer system
128 hardware interface
130 processor
132 user interface
136 computer storage
138 computer memory
140 k-space blade data
142 blade image data
144 water blade image data
146 fat blade image data
148 water k-space blade data
150 fat k-space blade data
160 control module
162 reconstruction module
164 separation module
166 propeller module
301 k-space matrix
303 k-space blade
305 k-space line
307 central point
309 central region

The invention claimed is:

1. A magnetic resonance imaging system configured for acquiring two or more sets of k-space blade data from an imaging zone of a subject, each k-space blade data set being composed of the L lines of a k-space trajectory with Cartesian sampling and the individual k-space blades being rotated relative to one another around a central point of k-space wherein the magnetic resonance imaging system comprises:

a non-transitory memory storing non-transitory machine executable instructions; and a processor configured for controlling the magnetic resonance imaging system, wherein execution of the non-transitory machine executable instructions causes for each blade of the two or more sets of k-space blade data, the processor to perform the steps of:

controlling the MRI system in order to acquire k-space blade data using at least one echo time while performing a Dixon technique, wherein k-space blade data are acquired in accordance with a blade shape;

reconstructing at least one blade image from each blade of the two or more sets of k-space blade data;

generating a water blade image and a fat blade image using a Dixon technique applied to each blade image from the reconstructing step;

transforming the generated water and fat blade images back into water and fat k-space blade data respectively; and performing PROPELLER reconstruction on the transformed water k-space blade data generated from the transforming step in order to generate a water image and performing PROPELLER reconstruction on the fat k-space blade data generated from the transforming step in order to generate a fat image.

2. The magnetic resonance imaging system of claim 1, wherein the generating step comprises applying a water-fat shift correction to the generated fat blade image.

3. The magnetic resonance imaging system of claim 2, wherein the water-fat shift correction applied to the fat blade image comprises correcting the expected pixel shift in the readout direction that is either defined by the frequency bandwidth and/or defined by a registering of the fat blade image relative to a registering of the water blade image.

4. The magnetic resonance imaging system of claim 1, wherein the Dixon technique is at least a two-point Dixon technique, with the reconstructed at least one blade image comprising at least two blade images, and wherein the execution of the non-transitory machine executable instructions further causes the processor to combine the reconstructed at least two blade images in order to produce the generated water and fat blade images.

5. The magnetic resonance imaging system of claim 4, wherein the execution of the non-transitory machine executable instructions further causes the processor to estimate a $B_0$ field inhomogeneity map from the at least two blade images.

6. The magnetic resonance imaging system of claim 5, wherein the estimated $B_0$ field inhomogeneity map is used to correct for off resonance effects in the water and fat blade images and thereby remove off resonance streaking and blur artifacts.

7. The magnetic resonance imaging system of claim 1, wherein the execution of the non-transitory machine executable instructions further causes the processor to:

reconstruct a water motion image using a central region of the water k-space blade data that was previously obtained from the transformation step;

define a water reference blade;

determine a water affine motion transformation of at least part of the reconstructed water motion image by having the processor register the water motion image relative to the defined water reference blade; and correct the water k-space blade data that was previously obtained from the transformation step with respect to motion using the water affine motion transformation.

8. The magnetic resonance imaging system of claim 1, wherein the execution of the non-transitory machine executable instructions further causes the processor to:

reconstruct a fat motion image using a central region of the fat k-space blade data that was previously obtained from the transformation step;

define a fat reference blade;

determine a fat affine motion transformation of at least part of the reconstructed fat motion image by having the processor register the fat motion image relative to the defined fat reference blade; and correct the fat k-space blade data that was previously obtained from the transformation step with respect to motion using the fat affine motion transformation.

9. A method implemented by and with a processor configured for acquiring with an MRI system two or more sets of k-space blade data from an imaging zone of a subject, each k-space blade data set blade being composed of the L lines of a k-space trajectory with Cartesian sampling and the individual k space blades being rotated relative to one another around a central point of k space, wherein for each blade of the two or more sets of k-space blade data, the processor performs the steps comprising:

controlling the MRI system in order to acquire k-space blade data using at least one echo time while performing a Dixon technique, wherein k-space blade data are acquired in accordance with a blade shape;

reconstructing at least one blade image from each blade of the two or more sets of k-space blade data;

generating a water blade image and a fat blade image using a Dixon technique applied to each blade image from the reconstructing step;

transforming the generated water and fat blade images back into water and fat k-space blade data respectively; and performing PROPELLER reconstruction on the transformed water k-space blade data generated from the transforming step in order to generate a water image and performing PROPELLER reconstruction on the fat k-space blade data generated from the transforming step in order to generate a fat image.

10. A non-transitory computer readable medium storing non-transitory instructions that when executed by at least one computer processor, cause the computer processor to perform a method that acquires with an MRI system two or more sets of k-space blade data from an imaging zone of a subject, each k-space blade data set being composed of the L lines of a k-space trajectory with Cartesian sampling and the individual k-space blades being rotated relative to one another around a central point of k-space, wherein for each blade of the two or more sets of k-space blade data, the processor performs the steps comprising:

controlling the MRI system in order to acquire k-space blade data using at least one echo time while performing a Dixon technique, wherein k-space blade data are acquired in accordance with a blade shape;

reconstructing at least one blade image from each blade of the two or more sets of k-space blade data;

generating a water blade image and a fat blade image using a Dixon technique applied to each blade image from the reconstructing step;

transforming the generated water and fat blade images back into water and fat k-space blade data respectively; and performing PROPELLER reconstruction on the transformed water k-space blade data generated from the transforming step in order to generate a water image and performing PROPELLER reconstruction on the fat k-space blade data generated from the transforming step in order to generate a fat image.

11. The method of claim 9, wherein the generating step comprises
the processor applying a water-fat shift correction to the generated fat blade image by correcting the expected pixel shift in the readout direction that is either defined by the frequency bandwidth and/or defined by a registering of the fat blade image relative to a registering of the water blade image.

12. The method of claim 9,
wherein the Dixon technique is at least a two-point Dixon technique, with the reconstructed at least one blade image comprising:
at least two blade images, and
wherein the execution of the non-transitory machine executable instructions further causes the processor to combine the reconstructed at least two blade images in order to produce the generated water and fat blade images and
wherein the method further includes estimating a $B_0$ field inhomogeneity map from the reconstructed at least two blade images in order to correct for off resonance effects in the water and fat blade images and thereby remove off resonance streaking and blur artifacts from the generated water and fat blade images.

13. The method of claim 9, further including the processor performing the steps of:
reconstructing a water motion image using a central region of the water k-space blade data that was previously obtained from the transformation step;
defining a water reference blade;
determining a water affine motion transformation of at least part of the reconstructed water motion image by having the processor register the water motion image relative to the defined water reference blade; and
correcting the water k-space blade data that was previously obtained from the transformation step with respect to motion using the water affine motion transformation.

14. The method of claim 9, further including the processor performing the steps of:
reconstructing a fat motion image using a central region of the fat k-space blade data that was previously obtained from the transformation step;
defining a fat reference blade;
determining a fat affine motion transformation of at least part of the reconstructed fat motion image by having the processor register the fat motion image relative to the defined fat reference blade; and
correcting the fat k-space blade data that was previously obtained from the transformation step with respect to motion using the fat affine motion transformation.

15. The non-transitory computer readable medium of claim 10, wherein the generating step comprises
the processor applying a water-fat shift correction to the generated fat blade image by correcting the expected pixel shift in the readout direction that is either defined by the frequency bandwidth and/or defined by a registering of the fat blade image relative to a registering of the water blade image.

16. The non-transitory computer readable medium of claim 10,
wherein the Dixon technique is at least a two-point Dixon technique, with the reconstructed at least one blade image comprising:
at least two blade images, and
wherein the execution of the non-transitory machine executable instructions further causes the processor to combine the reconstructed at least two blade images in order to produce the generated water and fat blade images and
wherein the method further includes estimating a $B_0$ field inhomogeneity map from the reconstructed at least two blade images in order to correct for off resonance effects in the water and fat blade images and thereby remove off resonance streaking and blur artifacts from the generated water and fat blade images.

17. The non-transitory computer readable medium of claim 10, wherein the method further includes the processor performing the steps of:
reconstructing a water motion image using a central region of the water k-space blade data that was previously obtained from the transformation step;
defining a water reference blade;
determining a water affine motion transformation of at least part of the reconstructed water motion image by having the processor register the water motion image relative to the defined water reference blade; and
correcting the water k-space blade data that was previously obtained from the transformation step with respect to motion using the water affine motion transformation.

18. The non-transitory computer readable medium of claim 10, wherein the method further includes the processor performing the steps of:
reconstructing a fat motion image using a central region of the fat k-space blade data that was previously obtained from the transformation step;
defining a fat reference blade;
determining a fat affine motion transformation of at least part of the reconstructed fat motion image by having the processor register the fat motion image relative to the defined fat reference blade; and
correcting the fat k-space blade data that was previously obtained from the transformation step with respect to motion using the fat affine motion transformation.

\* \* \* \* \*